United States Patent
Kang et al.

(10) Patent No.: US 7,777,999 B2
(45) Date of Patent: Aug. 17, 2010

(54) ELECTROSTATIC DISCHARGE (ESD) PROTECTION DEVICE

(75) Inventors: Myoung-Gon Kang, Suwon-si (KR); Ki-Whan Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 426 days.

(21) Appl. No.: 11/969,966

(22) Filed: Jan. 7, 2008

(65) Prior Publication Data
US 2008/0174924 A1 Jul. 24, 2008

(30) Foreign Application Priority Data
Jan. 23, 2007 (KR) .................. 10-2007-0006945

(51) Int. Cl.
*H02H 9/00* (2006.01)
(52) U.S. Cl. .................. 361/56; 361/91.1; 361/111; 257/173; 257/355; 257/360
(58) Field of Classification Search ............ 361/56, 361/91.1, 111; 257/107–182, 355–360
See application file for complete search history.

(56) References Cited

U.S. PATENT DOCUMENTS

| | | | | |
|---|---|---|---|---|
| 5,452,171 A | * | 9/1995 | Metz et al. ................. 361/56 |
| 5,455,436 A | * | 10/1995 | Cheng ...................... 257/356 |
| 5,637,887 A | * | 6/1997 | Consiglio .................. 257/109 |
| 5,949,634 A | * | 9/1999 | Yu ............................ 361/111 |
| 6,066,879 A | | 5/2000 | Lee et al. |
| 6,696,708 B2 | | 2/2004 | Hou et al. |
| 6,850,397 B2 | * | 2/2005 | Russ et al. ................. 361/91.8 |
| 6,987,303 B2 | * | 1/2006 | Yu ............................ 257/371 |
| 2003/0090845 A1 | * | 5/2003 | Ker et al. .................... 361/56 |
| 2007/0069310 A1 | * | 3/2007 | Song et al. ................. 257/409 |
| 2007/0228412 A1 | * | 10/2007 | Yang et al. ................. 257/173 |

FOREIGN PATENT DOCUMENTS

| | | |
|---|---|---|
| JP | 2001358227 A | 12/2001 |
| JP | 2002261238 A | 9/2002 |
| JP | 2006040923 | 2/2006 |
| KR | 1019990072237 A | 9/1999 |
| KR | 1020010024361 A | 3/2001 |
| KR | 1020030008988 A | 1/2003 |
| KR | 1020040032887 A | 4/2004 |
| KR | 1020040061964 A | 7/2004 |

* cited by examiner

*Primary Examiner*—Jared J Fureman
*Assistant Examiner*—Terrence R Willoughby
(74) *Attorney, Agent, or Firm*—Volentine & Whitt, PLLC

(57) ABSTRACT

An electrostatic discharge (ESD) protection device includes an I/O terminal structure and a current discharge structure. The current discharge structure includes a conductive region separated from a bridge region by a gate electrode, a well region formed below the conductive region, another well region separated from the well region by another conductive region, and multiple additional conductive regions implementing dual current discharge paths through another well region.

18 Claims, 9 Drawing Sheets

ELECTROSTATIC DISCHARGE (ESD) PROTECTION DEVICE

CROSS-REFERENCE TO RELATED APPLICATION

This application claims the benefit of Korean Patent Application No. 2007-0006945, filed Jan. 23, 2007, the subject matter of which is hereby incorporated by reference.

BACKGROUND OF THE INVENTION

1. Field of the Invention

The present invention relates to an electrostatic discharge (ESD) protection device. More particularly, the invention relates to an ESD protection device having a relatively lower trigger voltage and a relatively higher holding voltage.

2. Description of Related Art

The internal circuitry of contemporary semiconductor integrated circuits (ICs) is very sensitive to, and may be damaged by the application of elevated voltages or currents, such as those commonly induced by a discharge of static electricity (or an electro static discharge, "ESD"). When an elevated voltage or current induced by ESD reaches the material layers forming the internal circuitry of a semiconductor IC one or more insulating films may be destroyed or various conductive elements may be short-circuited by the voltage/current impulse. Such damage often destroys the semiconductor IC.

In order to prevent this phenomenon, most contemporary semiconductor ICs incorporate some form of ESD protection related to their Input/Output (I/O) circuitry. Generally speaking, ESD protection is designed to discharge the high voltages (and resulting currents) associated with ESD, thereby preventing the potentially damaging effects from reaching the internal circuitry of the semiconductor IC. A grounded gate NMOS (GGNMOS) or a semiconductor controlled rectifier (SCR) are common elements used to implement ESD protection.

Figure (FIG.) 1 is a schematic structural view a GGNMOS of the sort used in conventional ESD protection. Dual n+ regions 11 and 12 are formed in a p-type substrate 10 and separated across a gate electrode 14. A p+ region 13 is formed at a predetermined distance from n+ region 12 with an insulating region 15 interposed between n+ region 12 and p+ region 13. An I/O terminal (DQ) is connected to n+ region 11, with an n+ region 12, p+ region 13 and gate electrode 14 being connected to a first power voltage (e.g., ground voltage Vss in the illustrated example).

The operation of the GGNMOS shown in FIG. 1 will now be described.

When high voltage is applied to the I/O terminal DQ as the result of an ESD event, a breakdown occurs across the p-n junction between n+ region 11 and p-type substrate 10, such that current associated with the high voltage application flows through n+ region 11, p-type substrate 10 and p+ region 13. As a result, a forward bias is applied between p-type substrate 10 and n+ region 12, such that current flows from I/O terminal DQ to ground through n+ region 11, p-type substrate 10 and n+ region 12.

FIG. 2 is an equivalent circuit diagram for the GGNMOS shown in FIG. 1. Dual n+ regions 11 and 12 and gate electrode 14 form a drain, a source and a gate of an NMOS transistor N1, respectively. The n+ regions 11 and 12 and p-type substrate 10 form a collector, an emitter and a base of a junction transistor Q1, respectively. In FIG. 2, the element designated by "Rp" denotes an equivalent resistor associated with p-type substrate 10.

Operation of the equivalent circuit shown in FIG. 2 will now be described.

If more than a predetermined voltage (i.e., trigger voltage) at which breakdown occurs across the p-n junction between n+ region 11 and p-type substrate 10 is applied to the I/O terminal DQ, current flows through the collector and the base of the junction transistor Q1 and the resistor Rp. Due to this current, a base voltage for the junction transistor Q1 is raised to turn ON the junction transistor Q1, such that a large amount of current flows from the I/O terminal DQ to ground through the junction transistor Q1.

Consistent with the foregoing, in order to allow a larger amount of current to flow, the area occupied by the GGNMOS must be relatively large. However, implementing this relatively large GGNMOS is difficult given the contemporary drivers towards more dense element integration within semiconductor ICs. For this reason, the SCR has been proposed as a possible replacement for the GGNMOS in similar ESD protection circuits.

FIG. 3 is a schematic diagram of a SCR like those commonly used in conventional ESD protection. A n-well 21 is formed in a p-type substrate 20, and an n+ region 31 and a p+ region 32 are formed in n-well 21 spaced apart from each other. An n+ region 33 is formed to contact with both n-well 21 and p-type substrate 20 at a predetermined distance from p+ region 32. Separate insulating region 30 is interposed between n+ region 31 and p+ region 32 and between p+ region 32 and n+ region 33. An n+ region 34 is formed at a predetermined distance from n+ region 33, and a gate electrode 40 is formed on p-type substrate 20 between n+ region 33 and n+ region 34. A p+ region 35 is formed at a predetermined distance from n+ region 34, and insulating film 30 is interposed between n+ region 34 and p+ region 35. An I/O terminal DQ is connected to n+ region 31 and p+ region 32, and n+ region 34, p+ region 35 and gate electrode 40 are connected to ground voltage Vss.

The operation of the SCR shown in FIG. 3 will now be described.

If a high voltage associated with an ESD event is applied to the I/O terminal DQ, a breakdown occurs across the p-n junction between n-well 21 and p-type substrate 20, such that current flows through n+ region 31, n-well 21, p-type substrate 20 and p+ region 35. As a result, a forward bias is applied between p+ region 32 and n-well 21 by the current, such that the current flows through p+ region 32, n-well 21, and p-type substrate 20. Accordingly, a forward bias is applied between p-type substrate 20 and n+ region 34, such that current flows through n-well 21, p-type substrate 20 and n+ region 34.

FIG. 4 is a circuit diagram illustrating an equivalent circuit of the SCR shown in FIG. 3. Here, n-well 21, p-type substrate 20 and n+ region 34 form a collector, a base and an emitter of a junction transistor Q1, respectively. The p+ region 32, n-well 21 and p-type substrate 20 form a collector, a base and an emitter of a junction transistor Q2, respectively. The n+ region 33, gate electrode 40 and n+ region 34 form a drain, a gate and a source of an NMOS transistor N1, respectively. In FIG. 4, "Rn" denotes an equivalent resistor formed by n-well 21, and "Rp1" denotes an equivalent resistor formed by p-type substrate 20. The junction transistor Q1 is connected between the resistor Rn and ground voltage Vss, the junction transistor Q2 is connected between the I/O terminal DQ and the resistor Rp1, the base of the junction transistor Q1 is connected to the collector of the junction transistor Q2, the base of the junction transistor Q2 is connected to the collector of the junction transistor Q1, the NMOS transistor N1 is connected in parallel with the junction transistor Q1, and ground voltage Vss is applied to the gate of the NMOS transistor N1. The resistor Rn is connected to the I/O terminal DQ, and the resistor Rp1 is connected to ground voltage Vss.

FIG. 5 is a graph further illustrating the operation of the SCR shown in FIGS. 3 and 4. When a voltage applied to the I/O terminal DQ is less than a trigger voltage Vt, current is unlikely to flow since the SCR has a relatively high resistance value (graph section 1 of FIG. 5). If the applied voltage rises above the trigger voltage Vt due to an ESD event, a breakdown occurs in the p-n junction between n-well 21 and p-type substrate 20, such that current flows between nodes A and B (see, FIG. 4) and the voltage at the I/O terminal DQ abruptly decreased according to snapback phenomenon (graph section 2 of FIG. 5). When current flowing through the SCR increases above the holding current Ih, both junction transistors Q1 and Q2 are turned ON to discharge the relatively large current (graph section 3 of FIG. 5). Thus, the voltage apparent at the I/O terminal DQ of when both junction transistors Q1 and Q2 are turned ON is equal to the holding voltage Vh.

However, while the SCRs of FIGS. 3 and 4 are able to discharge a larger amount of current than the GGNMOS of FIGS. 1 and 2 when implemented within a similar area size, they commonly suffer from relatively high trigger voltage Vt values and relatively low holding voltage Vh values.

SUMMARY OF THE INVENTION

Embodiments of the invention provide an ESD protection device having a reduced trigger voltage and an increased holding voltage relative to conventional devices.

In one embodiment, the invention provides an electrostatic discharge (ESD) protection device formed in a substrate of first conductivity type (FCT), and comprising; an I/O terminal structure and a current discharge structure. The I/O terminal structure comprises; a first well region of second conductivity type (SCT) formed in the substrate, a first SCT region formed in the first well region and a first FCT region formed in the first well region and spaced apart from the first SCT region, the first SCT region and the first FCT region being connected to an I/O terminal, and bridge region of SCT formed in contact with the first well region and the substrate. The current discharge structure comprises; a second SCT region formed in the substrate and separated from the bridge region by a gate electrode, a second well region of SCT region formed in the substrate below the second SCT region, a third well region of SCT formed in the substrate and separated from the second well region by a second FCT region formed in the substrate, a third SCT region, a third FCT region, and a fourth SCT region spaced apart and formed in the third well region, and a fourth FCT region formed in the substrate on a side of the third well region opposite the second FCT region.

In another embodiment, the invention provides a multi-finger electrostatic discharge (ESD) protection device formed in a substrate of first conductivity type (FCT) and comprising a common I/O terminal structure centered between first and second current discharge structures. The common I/O terminal structure comprises; a first well region of second conductivity type (SCT) formed in the substrate and a first SCT region formed in the first well region and connected to an I/O terminal, dual first FCT regions formed in the first well region and spaced apart on opposite sides of the first SCT region, and dual bridge regions of SCT formed in contact with the first well region and the substrate and respectively separated from the first SCT region by one of the dual first FCT regions. Each one of the first and second current discharge structures comprises; a second SCT region formed in the substrate and separated from a respective one of the dual bridge regions by a gate electrode, a second well region of SCT region formed in the substrate below the second SCT region, a third well region of SCT formed in the substrate and separated from the second well region by a second FCT region formed in the substrate, a third SCT region, a third FCT region, and a fourth SCT region spaced apart and formed in the third well region, and a fourth FCT region formed in the substrate on a side of the third well region opposite the second FCT region. A coupling connector electrically couples the respective second FCT regions of the first and second current discharge structures.

In another embodiment, the invention provides an electrostatic discharge (ESD) protection device fabricated on a semiconductor substrate and having an equivalent circuit, comprising; a first junction transistor having a collector, a base and an emitter and a second junction transistor having a collector, a base and an emitter, wherein the collector of the first junction transistor is connected to the gate of the second junction transistor and the gate of the first junction transistor is connected to the emitter of the second junction transistor, a first resistor connecting an Input/Output (I/O) terminal to the collector of the first junction transistor, wherein the collector of the second junction transistor is connected to the I/O terminal, an NMOS transistor having a gate connected to ground, and a gate and a source respectively connected to the collector and emitter of the first junction transistor, second and third series connected resistors connecting the emitter of the second junction transistor to ground, and parallel first and second current discharge paths connecting the commonly connected NMOS transistor drain and first junction transistor emitter to ground.

In one related aspect, the first current discharge path may comprise a series connected combination of a fourth resistor and a first junction diode.

In another related aspect, the second current discharge path may comprise a series connected combination of a fifth resistor and a second junction diode, or a parallel resistor.

In another embodiment, the invention provides a multi-finger electrostatic discharge (ESD) protection device fabricated on a semiconductor substrate and having an equivalent circuit, comprising first and second current discharge structures connected to a common Input/Output (I/O) terminal. Each one of the first and second current discharge structures comprises; a first junction transistor having a collector, a base and an emitter and a second junction transistor having a collector, a base and an emitter, wherein the collector of the first junction transistor is connected to the gate of the second junction transistor and the gate of the first junction transistor is connected to the emitter of the second junction transistor, a first resistor connecting the I/O terminal to the collector of the first junction transistor, wherein the collector of the second junction transistor is connected to the I/O terminal, an NMOS transistor having a gate connected to ground, and a gate and a source respectively connected to the collector and emitter of the first junction transistor, second and third series connected resistors connecting the emitter of the second junction transistor to ground, parallel first and second current discharge paths connecting the commonly connected NMOS transistor drain and first junction transistor emitter to ground, and a coupling connector electrically connected between respective second and third series connected resistors in each one of the first and second current discharge structures.

DETAILED DESCRIPTION OF THE INVENTION

Figure 1:
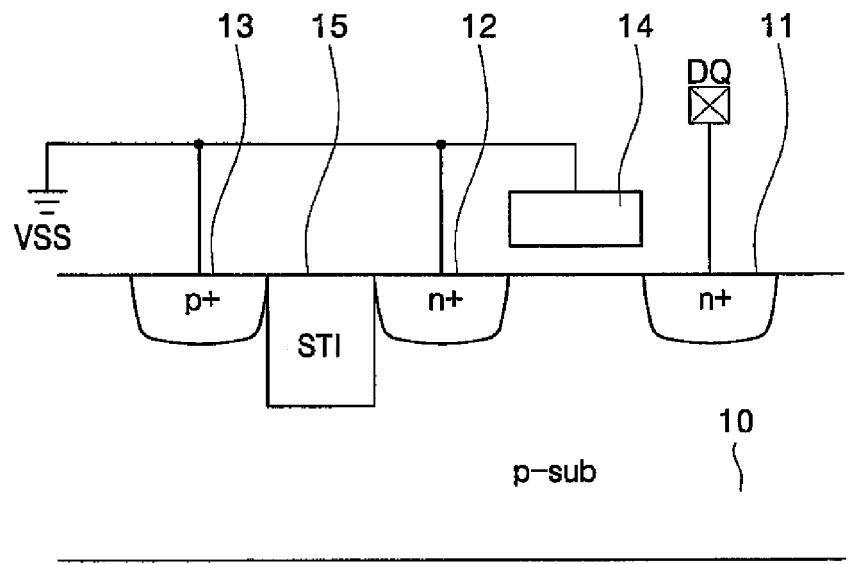
FIG. 1 is a schematic view illustrating a structure of a GGNMOS as a conventional ESD protection device.
Figure 2:
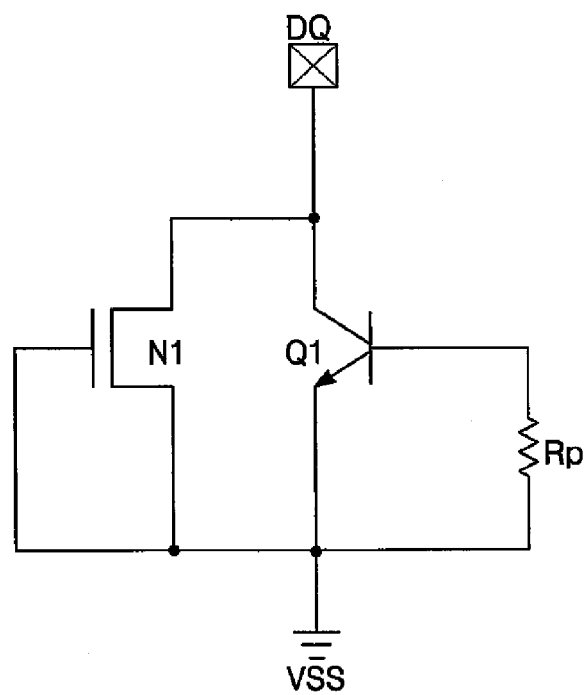
FIG. 2 is a circuit diagram illustrating an equivalent circuit of the GGNMOS of FIG. 1.

Exemplary embodiments of the invention will now be described with reference to the accompanying drawings. The invention may, however, be embodied in many different forms and should not be construed as being limited to only the illustrated embodiments. Rather, these embodiments are presented as teaching examples. In the drawings, the thickness of layers and regions and the relative thickness of layers and regions may be exaggerated for clarity of illustration. Throughout the drawings and written description, like numbers refer to like or similar elements.

The following embodiments will be described in the context of a p-type substrate. Those of ordinary skill in the art will recognize that similar ESD protection device may be fabricated using n-type substrates with conductivity type reversals for the various conductive regions formed therein. Without loss of generally, p-type and n-type conductivities may be alternately referred to hereafter as "first conductivity type" or "FCT" and "second conductivity type" or "SCT".

Figure 6:
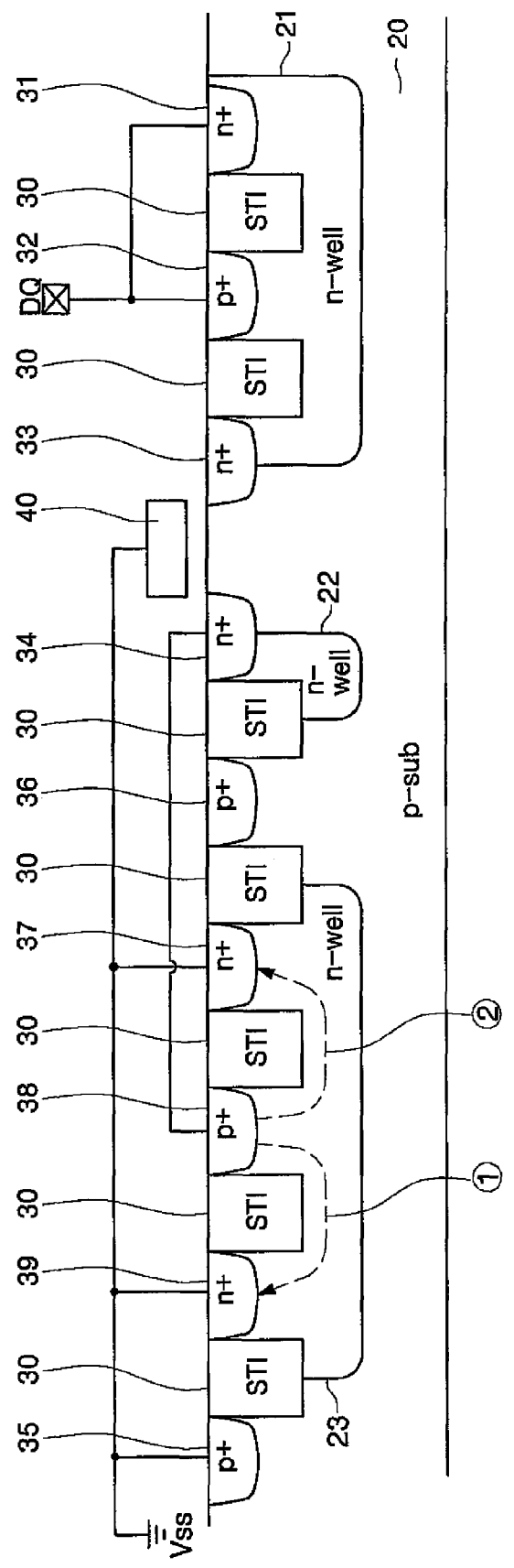
FIG. 6 is a schematic diagram illustrating an ESD protection device according to an embodiment of the invention.

FIG. 6 is a schematic diagram illustrating an ESD protection device according an embodiment of the invention. Here, a (first well region) n-well 21 is formed in a p-type substrate 20, and a (1st SCT region) n+ region 31 and a (1st FCT region ) p+ region 32 are formed in n-well 21 spaced apart from each other. A (SCT bridge region) n+ region 33 is formed in contact with both n-well 21 and p-type substrate 20 at a predetermined distance from p+ region 32. Separate insulating regions 30 are interposed between n+ region 31 and p+ region 32, and between p+ region 32 and n+ region 33. The foregoing is one exemplary I/O terminal structure.

Associated with the I/O terminal structure is a current discharge structure. In the illustrated embodiment of FIG. 6, the current discharge structure comprises; a (2nd SCT region) n+ region 34 is formed at a predetermined distance from n+ region 33, and a gate electrode 40 is formed on p-type substrate 20 between n+ region 33 and n+ region 34. A (2nd FCT region ) p+ region 36 is formed at a predetermined distance from n+ region 34 with insulating region 30 is interposed between n+ region 34 and p+ region 36, and a (2nd well region) n-well 22 is formed below n+ region 34 in p-type substrate 20.

A (3rd well region) n-well 23 is formed a predetermined distance from p+ region 36, and a (3rd SCT region) n+ region 37, a (3rd FCT region) p+ region 38 and a (4th SCT region) n+ region 39 are formed in the n-well region 23. A (4th FCT region) p+ region 35 is formed in p-type substrate 20 at a predetermined distance from n+ region 39. Separate insulating regions 30 are interposed between p+ region 36 and n+ region 37, between n+ region 37 and p+ region 38, between p+ region 38 and n+ region 39, and between n+ region 39 and p+ region 35. An I/O terminal DQ is connected to n+ region 31 and p+ region 32. Gate electrode 40, n+ regions 37 and 39 and p+ region 35 are connected to ground voltage Vss. The n+ region 34 is connected to the p+ region 38.

As indicated in FIG. 6, elements ① and ② denote paths through which current is discharged. If the SCR has a multi-finger structure, p+ region 36 is connected to the respective fingers, but such connection may be omitted if the SCR does not have a multi-finger structure.

An operation of the SCR shown in FIG. 6 will now be described.

Figure 3:
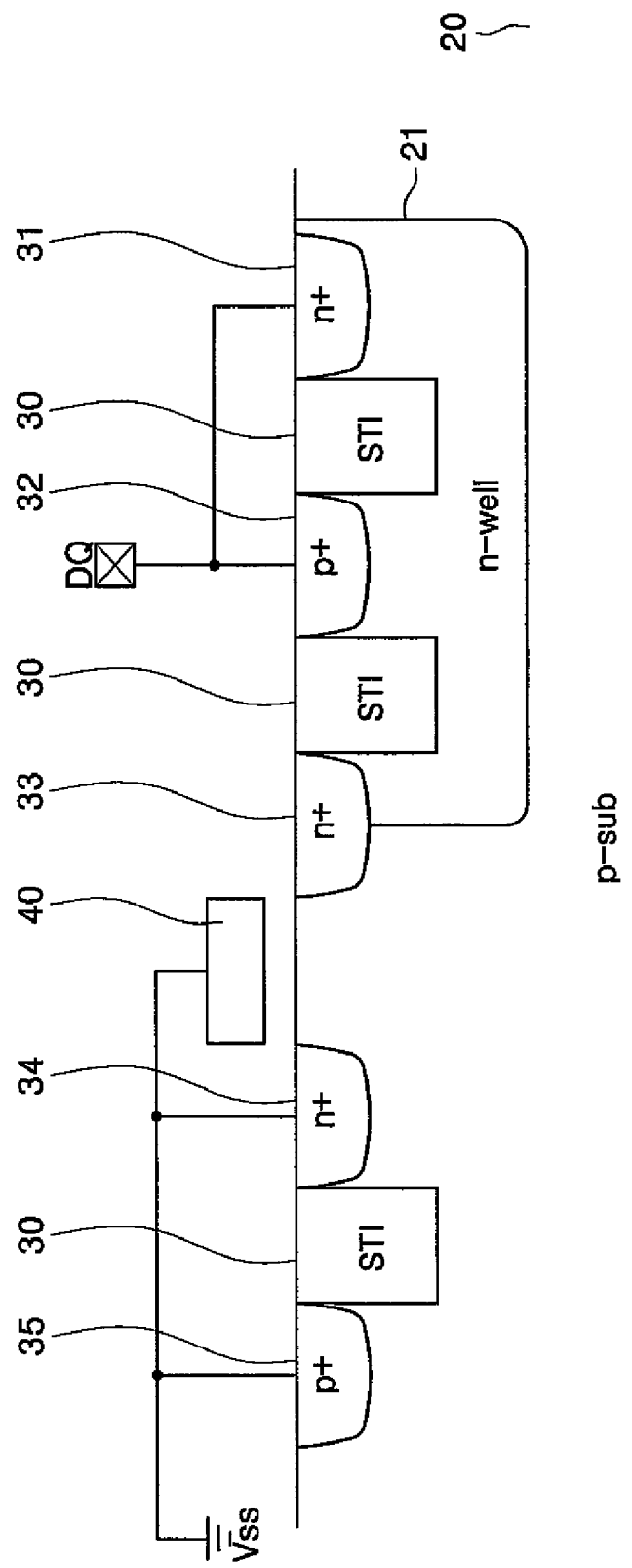
FIG. 3 is a schematic diagram illustrating a SCR as the conventional ESD protection device.

The operation of the SCR of FIG. 6 is basically similar to that previously described in the context of FIG. 3. However, there is an effect that a current gain is increased and the trigger voltage Vt is reduced since the resistance of the current path between p+ region 35 and ground voltage Vss through additionally form n-well 22 is increased, and an emitter area for corresponding the junction transistor Q1 is increased. Also, there is an effect that the holding voltage Vh is increased by the additional formation of n+ regions 37 and 39, p+ region 38 and n-well 23. That is, current discharge flows to ground voltage Vss via n+ regions 37 and 39 (path ① or ②) after passing through n+ region 34, p+ region 38 and n-well 23. At this time, a p-n junction diode is formed between p+ region 38 and n-well 23, whereby the holding voltage Vh is increased by the threshold voltage of the p-n junction diode.

Figure 7:
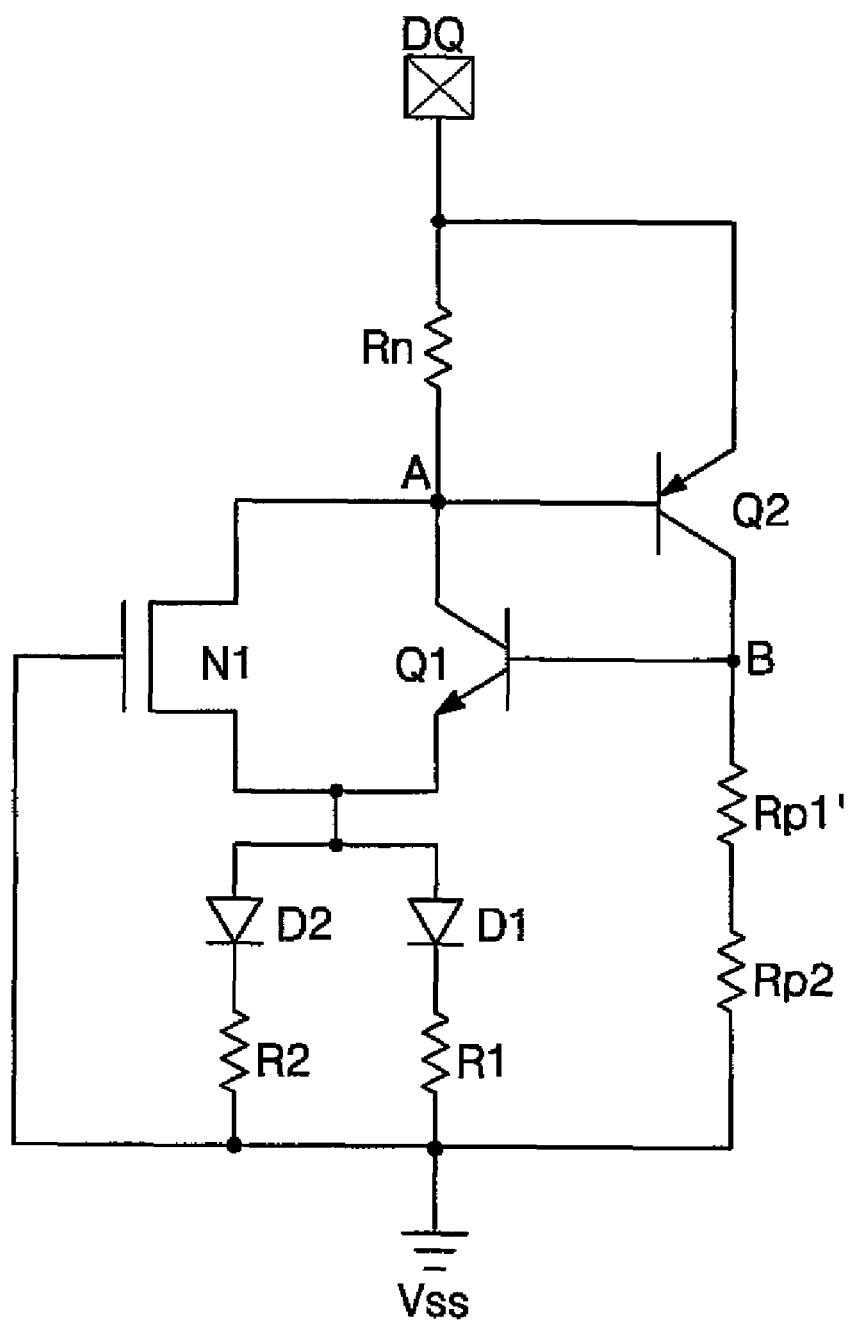
FIG. 7 is a circuit diagram illustrating an equivalent circuit for the ESD protection device of FIG. 6.

FIG. 7 is an equivalent circuit diagram for the ESD protection device shown in FIG. 6. Here, n-well 21, p-type substrate 20 and n+ region 34 form a collector, a base and an emitter of the first junction transistor Q1, respectively. The p+ region 32, n-well 21 and p-type substrate 20 form a collector, a base and an emitter of the second junction transistor Q2, respectively. The n+ region 33, gate electrode 40 and n+ region 34 form a drain, a gate and a source of the NMOS transistor N1, respectively. The p+ region 38 and n-well 23 form first and second junction diodes D1 and D2, respectively.

That is, junction diode D1 is a diode existing in path ① through which current is discharged from p+ region 38 to n+ region 39, and junction diode D2 is a diode existing in path ② through which current is discharged from p+ region 38 to n+ region 37. In FIG. 7, Rn denotes a first resistor for n-well 21, Rp1' denotes a second resistor for the portion of p-type substrate 20 between n+ region 31 and p+ region 36, Rp2 denotes a third resistor for the portion of p-type substrate 20 between p+ region 36 and p+ region 35, R1 denotes a fourth resistor for n-well 23 which exists in the path ①, and R2 denotes a fifth resistor for n-well 23 which exists in the path ②.

If it is assumed that the resistance of a resistor for the n-well 23 is Rnw, then resistance of R1 and R2 are Rnw/2 since the length of each current path is about half the length of n-well 23. The junction transistor Q1 is connected between the resistor Rn and ground voltage Vss, the junction transistor Q2 is connected between the I/O terminal DQ and the resistor Rp1', the base of the junction transistor Q1 is connected to the collector of the junction transistor Q2, and the base of the junction transistor Q2 is connected to the collector of the junction transistor Q1. The NMOS transistor N1 is connected in parallel with the junction transistor Q1 and receives ground voltage Vss through its gate. The resistor Rn is connected to the I/O terminal DQ, the resistor Rp1' is serially connected to the resistor Rp2, and the resistor Rp2 is connected to ground voltage Vss.

The operation of the SCR shown in FIG. 7 will now be described, but is basically similar to the operation described above with reference to FIGS. 4 and 5. However, since the resistance of the resistor Rp1' is larger than resistance of the resistor Rp1 of FIG. 4 due to n-well 22 as described in FIG. 6 and the resistor Rp2 is serially connected to the resistor Rp1', the resistance between the base of the junction transistor Q1 and ground voltage Vss becomes larger, whereby the trigger voltage Vt is reduced. Also, since the emitter area of the junction transistor Q1 is increased by n-well 22 such that the current gain of the junction transistor Q1 is increased, the trigger voltage Vt is effectively reduced. Also, the junction diode D1 and resistor R1 are connected in parallel to junction diode D2 and the resistor R2 between the NMOS transistor N1 and the junction transistor Q1 and ground voltage Vss. Thus, the holding voltage Vh is increased by the presence of junction diodes D1 and D2 and the resistors R1 and R2.

However, the ESD protection device of FIGS. 6 and 7 may have one disadvantage in that the trigger voltage Vt is increased only a little by the addition of junction diodes D1 and D2, and the holding voltage Vh may not be sufficiently increased since the resistors R1 and R2 are connected in parallel, thereby reducing the apparent resistance.

Figure 8:
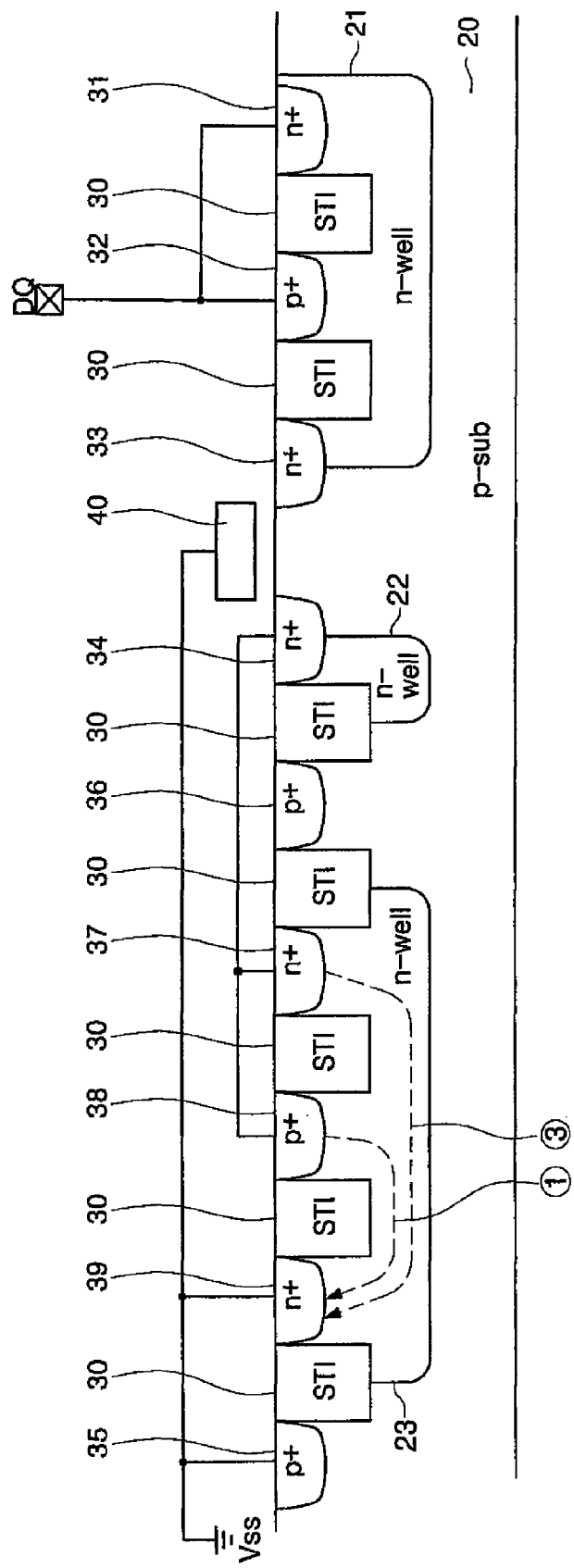
FIG. 8 is a schematic diagram illustrating an ESD protection device according to another embodiment of the invention.

FIG. 8 is a schematic diagram illustrating an ESD protection device according to another embodiment of the invention. The layout and relationship between the various regions shown in FIG. 8 are similar to those previously described in relation to FIG. 6. However, instead of n+ region 37 being connected to ground voltage Vss and gate electrode 40, it is connected to n+ region 34 and p+ region 38.

Thus, in FIG. 8, elements ① and ③ again denote current paths through which current may be discharged. However, at least current path ③ is different from the current paths identified in SCR shown in FIG. 6. As with the device of FIG. 6, if the SCR has a multi-finger structure, p+ region 36 in FIG. 8 may be connect to the respective fingers, but this connection may be omitted if the SCR does not have a multi-finger structure.

The operation of the ESD protection device shown in FIG. 8 will now be described, but it is analogous to that described in relation to FIGS. 3 and 6. That is, when a voltage less than the trigger voltage Vt is applied to the I/O terminal DQ, the ESD protection device is unlikely to allow current to flow due to its high impedance, but when a voltage higher than the trigger voltage is applied in the case of an ESD event, current flows to protect the internal circuitry and components of the constituent semiconductor IC. Also, when the voltage of the I/O terminal DQ is decreased and a voltage of the I/O terminal DQ becomes the holding voltage Vh due to snapback, the ESD protection device discharges a large amount of current.

The n-well 22 serves to reduce the trigger voltage Vt as described in FIG. 6. The n-well 23 and p+ region 38 and n+ regions 37 and 39 formed in the n-well 23 serve to increase the holding voltage Vh and to reduce the trigger voltage Vt. That is, the current generated in the operation described above flows to n+ region 37 and p+ region 38 through n+ region 34. At this time, if the flowing current is small, it will flows through n+ region 37, n-well 23 and n+ region 39 (i.e., through path ③), such that the trigger voltage Vt is decreased. That is, if the flowing current is small, the trigger voltage Vt is decreased since the current flows without passing through the p-n junction. Also, if the flowing current increases, it will flow through p+ region 38, n-well 23 and n+ region 39 (i.e., through path ①), such that the holding voltage Vh is increased by the p-n junction between p+ region 38 and n-well 23.

Thus, in the case of the ESD protection device shown in FIG. 6, discharge current flows to ground voltage Vss via n+ regions 37 and 39 after passing through n+ region 34, p+ region 38 and n-well 23 (i.e., through paths ① and ②), whereby it must pass through the p-n junction between p+ region 38 and n-well 23. As a result, the holding voltage is increased, and it causes the trigger voltage Vt to increase by a little. However, in case of the ESD protection device shown in FIG. 8, discharge current flows through the path ③ without passing through the p-n junction. Thus, it is possible to decrease the trigger voltage Vt when the flowing current is small, and it is possible to increase the holding voltage Vh since the current flows through the p-n junction (i.e., through path ①) when the flowing current is large.

Figure 9:
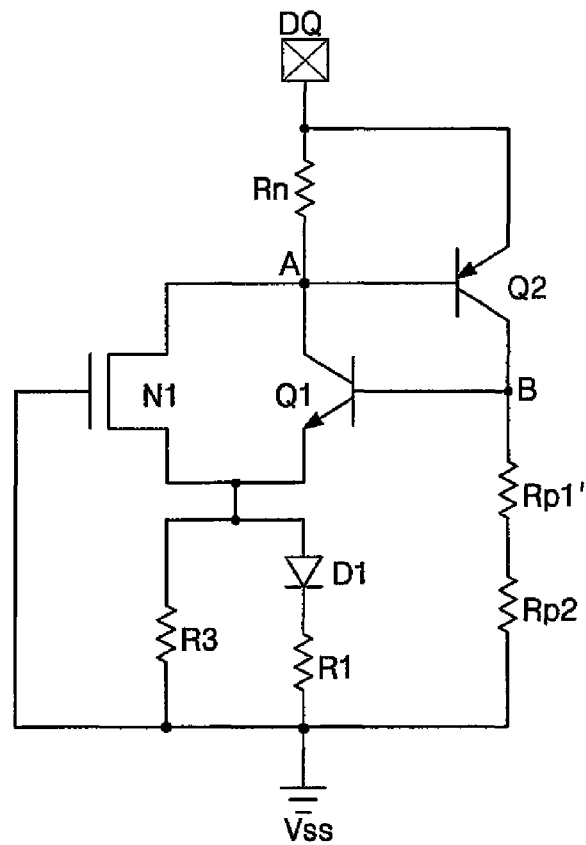
FIG. 9 is a circuit diagram illustrating an equivalent circuit for the ESD protection device of FIG. 8.

FIG. 9 is an equivalent circuit diagram for the ESD protection device of FIG. 8. It is similar in composition and operating nature, except for the replacement of second junction diode D2 and fifth resistor R2 with parallel resistor R3. Here, n-well 21, p-type substrate 20 and n+ region 34 form a collector, a base and an emitter of the junction transistor Q1, respectively. The p+ region 32, n-well 21 and p-type substrate 20 form a collector, a base and an emitter of the junction transistor Q2, respectively. The n+ region 33, gate electrode 40 and n+ region 34 form a drain, a gate and a source of the NMOS transistor N1, respectively. The p+ region 38 and n-well 23 form junction diodes D1.

In FIG. 9, Rn denotes a resistor for n-well 21, Rp1' denotes a resistor for a portion of p-type substrate 20 between n+ region 31 and p+ region 36, Rp2 denotes a resistor for a portion of p-type substrate 20 between p+ region 36 and p+ region 35, R1 denotes a resistor for n-well 23 which exists in the current discharge path ① flowing between p+ region 38 and n+ region 39, and R3 denotes a resistor of the n-well 23 which exists in the current discharge path ③ which exists between n+ region 37 and n+ region 39. If it is assumed that the resistance of n-well 23 is Rnw, resistance of R1 is Rnw/2, and resistance of R3 is Rnw.

Figure 4:
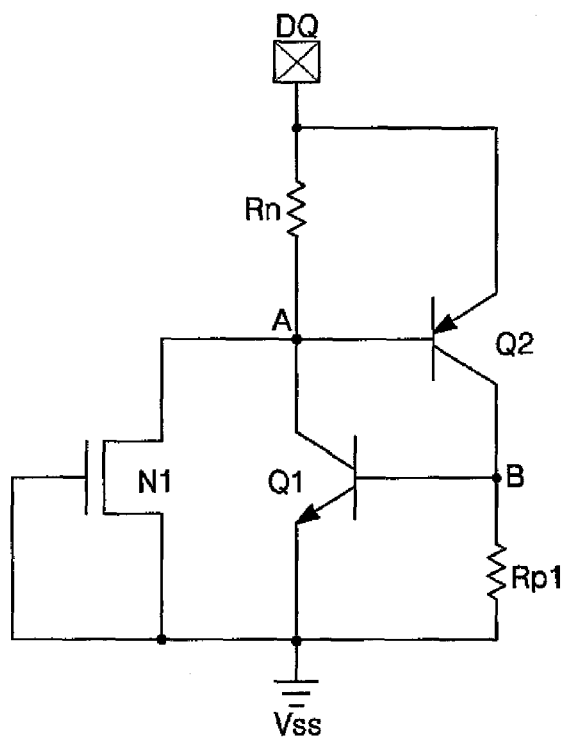
FIG. 4 is a circuit diagram illustrating an equivalent circuit of the SCR of FIG. 3.
Figure 5:
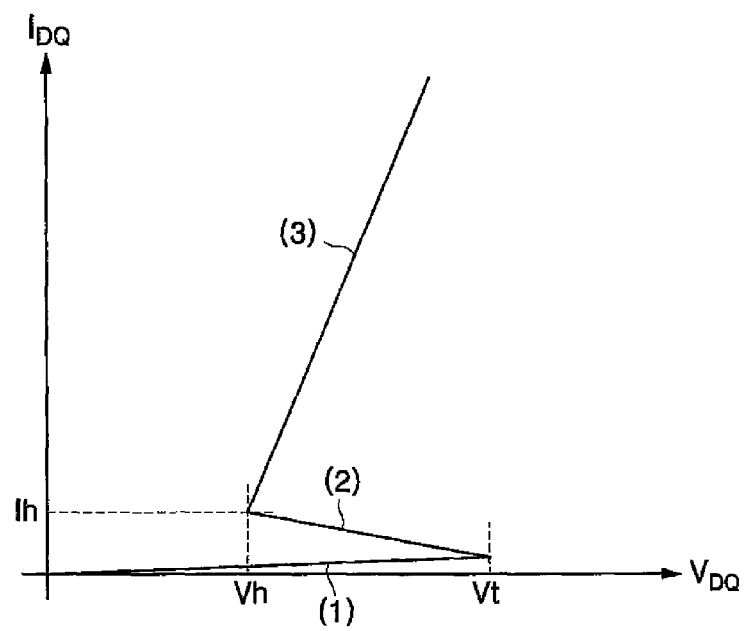
FIG. 5 is a graph illustrating operations of the SCR of FIGS. 3 and 4.

Operation of the ESD protection device shown in FIG. 9 will now be described, but it is basically analogous to the operation described with relation to FIGS. 4, 5 and 7. That is, if a voltage applied to the I/O terminal DQ is greater than the trigger voltage Vt due to an ESD event, the current starts to flow, and when it rises to the holding voltage Vh, the junction transistors Q1 and Q2 are turned ON to discharge a large amount of current.

The resistors Rp1' and Rp2 serve to decrease the trigger voltage Vt similarly to result described in relation to FIG. 6.

The diode D1 and the resistor R1 connected between the junction transistor Q1 and ground voltage Vss and parallel connected resistor R3 serve to decrease the trigger voltage Vt and increase the holding voltage Vh. That is, in the equivalent circuit of the ESD protection device of FIG. 7, discharge current is always allowed to flow through the diode, which causes the trigger voltage Vt to increase. In the equivalent of the ESD protection device of FIG. 9, when the current is small, it is controlled to flow through the resistor R3 (i.e., though path ③ in FIG. 8) to prevent the trigger voltage Vt from being increased due to the diode effect, thereby decreasing the trigger voltage Vt. Whereas, when discharge current is large, it is controlled to flow through the diode D1 and the resistor R1 (i.e., through path ① in FIG. 8), such that the holding voltage Vh is increased due to the diode D1. Also, in the ESD protection device of FIG. 7, two resistors R1 and R2 whose resistance are respectively Rnw/2 are connected in parallel, whereas in the ESD protection device of FIG. 9, a relatively larger resistance is provided, thereby increasing the holding voltage Vh.

Figure 10:
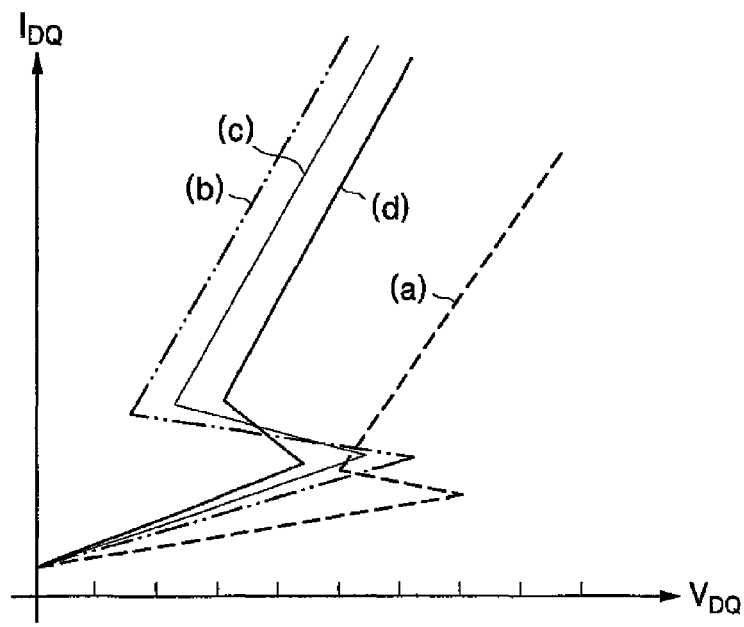
FIG. 10 is a graph comparing the operational characteristics for a conventional ESD protection device with one implemented according to an embodiment of the invention.

FIG. 10 is a graph illustrating various simulation results for the operation of an exemplary conventional ESD protection device and one implemented in accordance with an embodiment of the invention. In FIG. 10, plot (a) denotes the operating characteristics of a conventional GGNMOS such as the one shown in FIG. 1; plot (b) denotes the operating characteristics of a conventional SCR such as the one shown in FIG. 3. In contrast, plots (c) and (d) denote the operating characteristics of ESD protection devices respectively implemented according to the embodiments of the invention shown in FIGS. 6 and 8.

The ESD protection devices characterized by plots (c) and (d) are realized using a SCR having a reduced trigger voltage, and an increased holding voltage Vh, as compared with a conventional SCR (b). Additionally, the ESD protection devices characterized by plots (c) and (d) may be implemented using a GGNMOS with better effect by extrapolating the foregoing teachings (i.e., using a GGNMOS having a reduced trigger voltage Vt and increased holding voltage Vh).

Figure 11:
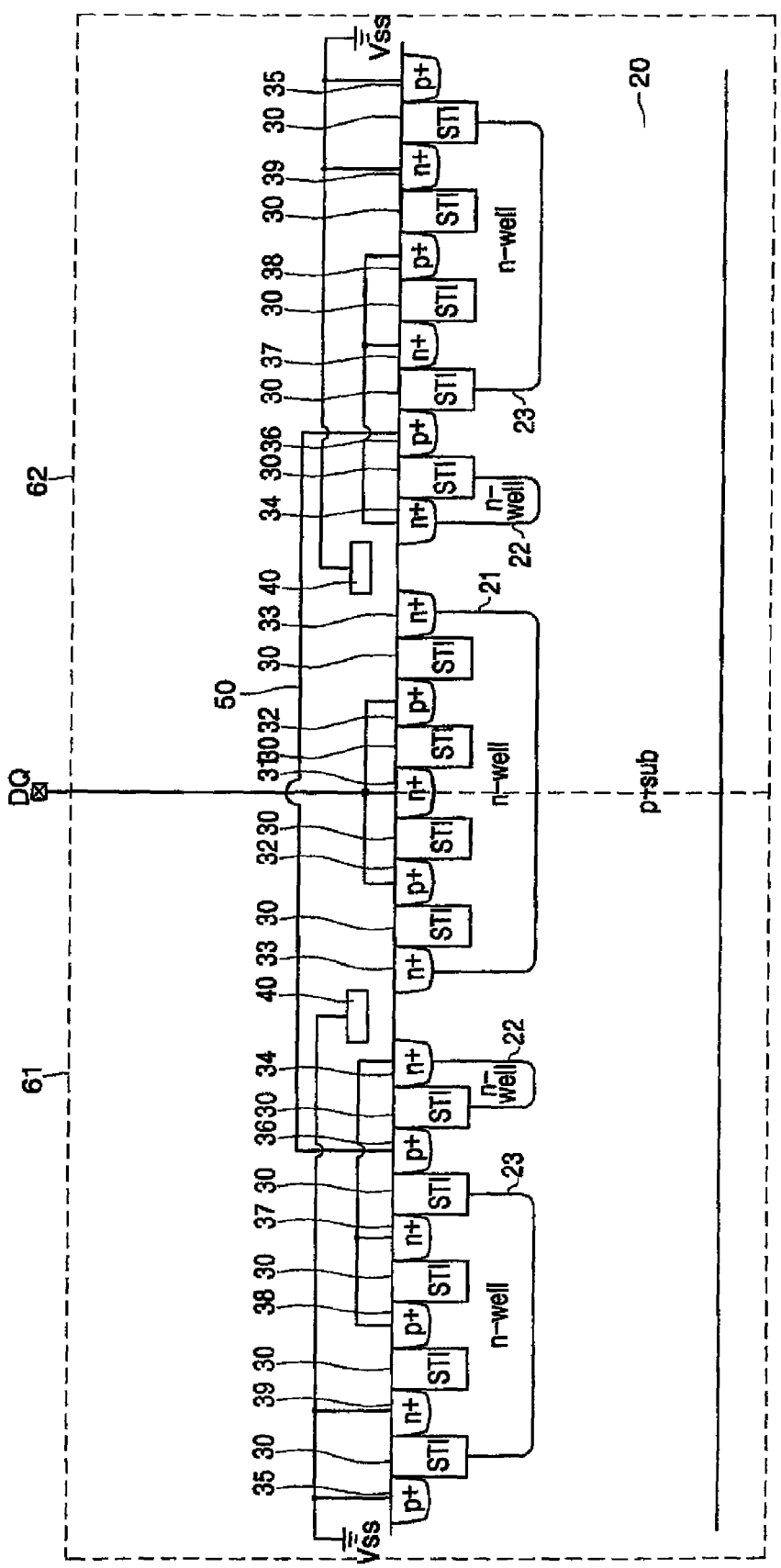
FIG. 11 is a schematic view illustrating a SCR having a multi-finger structure as the ESD protection device according to another embodiment of the invention.

FIG. 11 is a schematic view illustrating a SCR having a multi-finger structure and implemented as an ESD protection device according to another embodiment of the invention. In FIG. 11, each finger (e.g., 61 and 62) has the same structure as the ESD protection device shown, for example, in FIG. 8. In the illustrated example, n+ region 31 and n-well 21 are merged in a common I/O terminal structure, such that fingers 61 and 62 use a common n+ region 31 and n-well 21. Also, a coupling connector 50 couples fingers 61 and 62 by electrically connecting respective p+ regions 36. Coupling connector 50 may be realized by means of a conductive metal line, for example.

Figure 12:
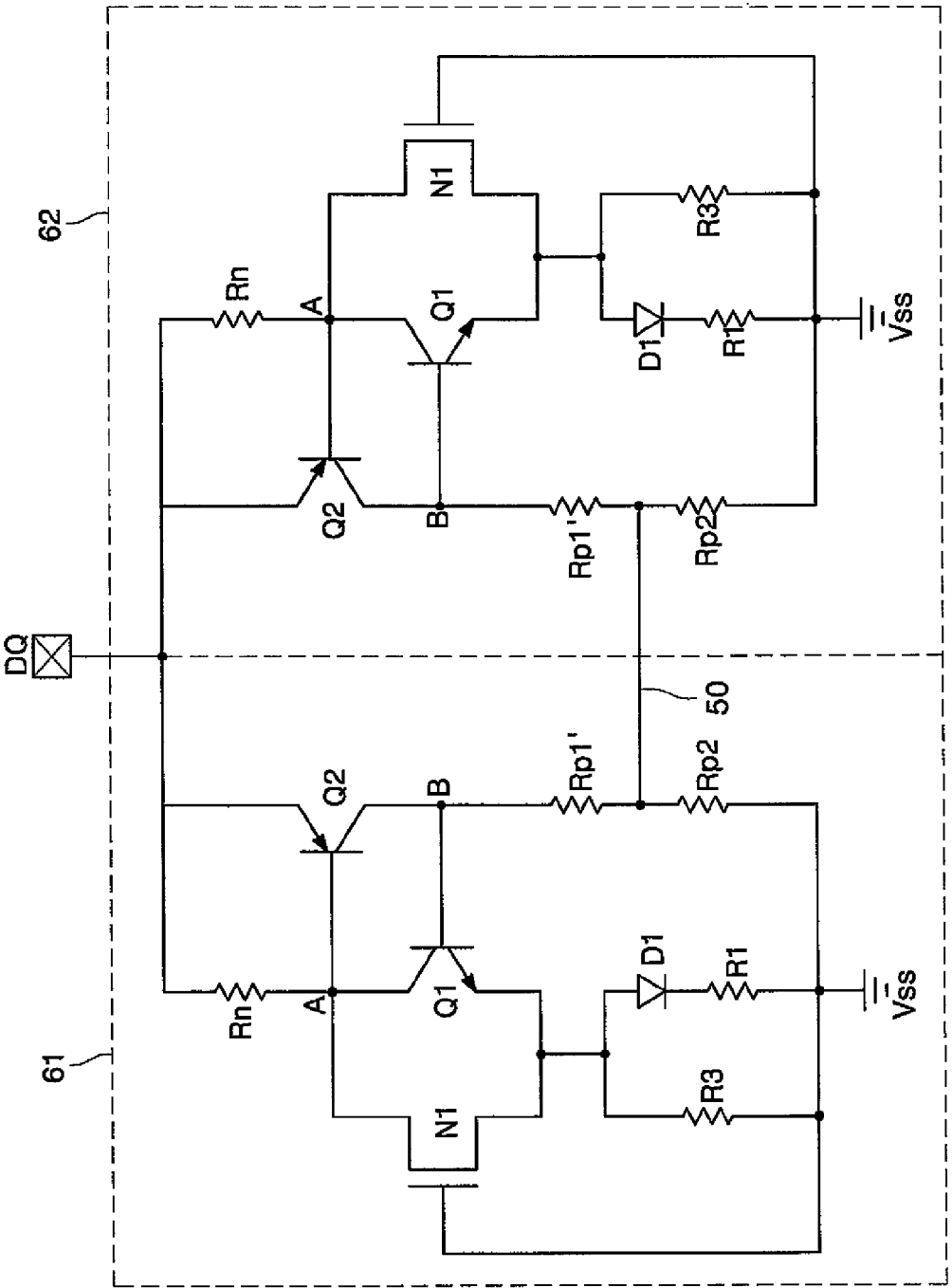
FIG. 12 is a circuit diagram illustrating an equivalent circuit for the ESD protection device of FIG. 11.

FIG. 12 is an equivalent circuit diagram for the ESD protection device shown in FIG. 11. Each of the fingers 61 and 62 has the same configuration as the equivalent circuit for the ESD protection device shown in FIG. 9.

Operation of the ESD protection device shown in FIGS. 11 and 12 will now be described, but each of the fingers 61 and 62 operates similarly to that of the circuits described in relation to FIGS. 8 and 9.

If a breakdown occurs in one finger such that current flows to the p-type substrate 20, part of the current is directed through coupling connector 50 to a portion of the p-type substrate 20 associated with of the other finger in which a breakdown has not occurred. The junction transistor Q1 of the other finger in which a breakdown does not occur allows an current to flow due to the supplied current, and the junction transistor Q2 of the other finger in which a breakdown does not occur also allows current to flow due to the current flowing through the junction transistor Q1. Thus, as the current gradually increases, the junction transistors Q1 and Q2 are turned ON, and the other finger in which a breakdown does not occur allows a large portion of the current to flow. Accordingly, the operating characteristics of any finger in the multiple finger devices are the same.

That is, in the ESD protection device of FIG. 6, the diode is added to increase the holding voltage Vh, but this may cause the trigger voltage Vt to be increased. However, in the ESD protection device of FIG. 8, current flows through the resistor without passing through the diode when the electric current is small, thereby preventing the trigger voltage Vt from being increased and bringing an effect for decreasing the trigger voltage Vt. Also, when the current is large, it flows through the diode, such that there is an effect of increasing the holding voltage Vh. Since the resistance of the path through which the current flows is increased, there is an effect that the holding voltage Vh is increased, as compared with the device shown in FIG. 6. As shown in FIGS. 6, 8 and 11, it may be preferable to additionally form the n-well (e.g., element 22 in FIGS. 6, 8 and 11) in order to further decrease the trigger voltage Vt. In case of the multi-finger structure, the coupling connector 50 is provided, and the fingers are configured to have similar electrical characteristics. FIGS. 11 and 12 show the SCR having the multi-finger structure as the ESD protection device of FIG. 8, but the multi-finger structure can be also applied to the ESD protection device of FIG. 6.

In the foregoing exemplary embodiments, the ESD protection devices corresponding to a positive transient voltage have been described, but the scope of this disclosure encompasses ESD protection devices having a negative transient voltage as well.

Also, the ESD protection devices described above have been implemented using an SCR, but the present invention can be applied to other types of ESD protection devices. For example, as previously suggested in relation to FIG. 10, the scope of the present invention subsumes ESD protection devices implemented using a GGNMOS, such as the one shown in FIG. 1. That is, by forming n-well 23 and n+ region 37, p+ region 38 and n+ region 39 which are formed in n-well 23 in FIG. 8 between n+ region 12 and p+ region 13, connecting n+ region 12 to n+ region 37 and p+ region 38, and connecting n+ region 39 and p+ region 13 to ground voltage Vss, the trigger voltage Vt may be decreased and the holding voltage Vh increased, as compared with conventional ESD protection devices implemented using a GGNMOS.

As described above, ESD protection devices according to embodiments of the invention provide reduced trigger voltages, increased current gain of the junction transistor, and/or increased resistance between the junction transistor and power node. Additionally, the holding voltage may be raised due to the additional diode.

The scope of the invention is set forth in the attached claims.

What is claimed is:

1. An electrostatic discharge (ESD) protection device formed in a substrate of first conductivity type (FCT), and comprising:
   an Input/Output (I/O) terminal structure comprising;
      a first well region of second conductivity type (SCT) formed in the substrate,
      a first SCT region formed in the first well region and a first FCT region formed in the first well region and spaced apart from the first SCT region, the first SCT region and the first FCT region being connected to an I/O terminal, and
      bridge region of SCT formed in contact with the first well region and the substrate;
   a current discharge structure comprising:
      a second SCT region formed in the substrate and separated from the bridge region by a gate electrode,
      a second well region of SCT region formed in the substrate below the second SCT region,
      a third well region of SCT formed in the substrate and separated from the second well region by a second FCT region formed in the substrate,
      a third SCT region, a third FCT region, and a fourth SCT region spaced apart and formed in the third well region, and a fourth FCT region formed in the substrate on a side of the third well region opposite the second FCT region.

2. The ESD protection device of claim 1, wherein the third FCT region and the second SCT region are electrically connected, and
the gate electrode, the third and fourth SCT regions, and the fourth FCT region are connected to a power supply voltage.

3. The ESD protection device of claim 1, wherein the second and third SCT regions and the third FCT region are electrically connected, and
the gate electrode, the fourth SCT region, and the fourth FCT region are connected to a power supply voltage.

4. The ESD protection device of claim 1, further comprising:
respective insulating regions separating the first FCT region from the first SCT region and the bridge region.

5. The ESD protection device of claim 4, further comprising:
an insulating region separating the second well region from the second FCT region
an insulating region separating the second FCT region from the third well region;
an insulating region separating the third SCT from the third FCT region in the third well region;
an insulating region separating the third FCT region from the fourth SCT region in the third well region; and
an insulating region separating the fourth SCT region from the fourth FCT region.

6. A multi-finger electrostatic discharge (ESD) protection device formed in a substrate of first conductivity type (FCT) and comprising:
a common Input/Output (I/O) terminal structure centered between first and second current discharge structures,
wherein the common I/O terminal structure comprises;
a first well region of second conductivity type (SCT) formed in the substrate,
a first SCT region formed in the first well region,
dual first FCT regions formed in the first well region and spaced apart on opposite sides of the first SCT region, the first SCT region and the dual first FCT region being connected to an I/O terminal, and
dual bridge regions of SCT formed in contact with the first well region and the substrate and respectively separated from the first SCT region by one of the dual first FCT regions;
wherein each one of the first and second current discharge structures comprises:
a second SCT region formed in the substrate and separated from a respective one of the dual bridge regions by a gate electrode,
a second well region of SCT region formed in the substrate below the second SCT region,
a third well region of SCT formed in the substrate and separated from the second well region by a second FCT region formed in the substrate,
a third SCT region, a third FCT region, and a fourth SCT region spaced apart and formed in the third well region,
a fourth FCT region formed in the substrate on a side of the third well region opposite the second FCT region; and
a coupling connector electrically coupling the respective second FCT regions of the first and second current discharge structures.

7. The multi-finger ESD protection device of claim 6, wherein within each one of the first and second current discharge structures, the third FCT region and the second SCT region in are electrically connected, and
the gate electrode, the third and fourth SCT regions, and the fourth FCT region are connected to a power supply voltage.

8. The multi-finger ESD protection device of claim 6, wherein within each one of the first and second current discharge structures, the second and third SCT regions and the third FCT region are electrically connected, and
the gate electrode, the fourth SCT region, and the fourth FCT region are connected to a power supply voltage.

9. The multi-finger ESD protection device of claim 6, further comprising:
respective insulating regions separating the first FCT region from the dual first SCT regions; and
respective insulating regions separating the dual first SCT regions from a respective one of the dual bridge regions.

10. The ESD protection device of claim 9, further comprising within each one of the first and second current discharge structures:
an insulating region separating the second well region from the second FCT region
an insulating region separating the second FCT region from the third well region;
an insulating region separating the third SCT from the third FCT region in the third well region;
an insulating region separating the third FCT region from the fourth SCT region in the third well region; and
an insulating region separating the fourth SCT region from the fourth FCT region.

11. An electrostatic discharge (ESD) protection device fabricated on a semiconductor substrate and having an equivalent circuit, comprising:
a first junction transistor having a collector, a base and an emitter and a second junction transistor having a collector, a base and an emitter, wherein the collector of the first junction transistor is connected to the base of the second junction transistor and the base of the first junction transistor is connected to the collector of the second junction transistor;
a first resistor connecting an Input/Output (I/O) terminal to the collector of the first junction transistor, wherein the emitter of the second junction transistor is connected to the I/O terminal;
an NMOS transistor having a gate connected to a power supply voltage, and a drain and a source respectively connected to the collector and emitter of the first junction transistor;
second and third series connected resistors connecting the collector of the second junction transistor to the power supply voltage; and
parallel first and second current discharge paths to which the source of the NMOS transistor and the emitter of the first junction transistor are commonly connected so as to discharge current into the power supply voltage.

12. The ESD protection device of claim 11, wherein the first current discharge path comprises a series connected combination of a fourth resistor and a first junction diode.

13. The ESD protection device of claim 12, wherein the second current discharge path comprises a series connected combination of a fifth resistor and a second junction diode.

14. The ESD protection device of claim 12, wherein the second current discharge path comprises a parallel resistor.

15. A multi-finger electrostatic discharge (ESD) protection device fabricated on a semiconductor substrate and having an equivalent circuit, comprising:

first and second current discharge structures connected to a common Input/Output (I/O) terminal, wherein each one of the first and second current discharge structures comprises;
- a first junction transistor having a collector, a base and an emitter and a second junction transistor having a collector, a base and an emitter, wherein the collector of the first junction transistor is connected to the base of the second junction transistor and the base of the first junction transistor is connected to the collector of the second junction transistor;
- a first resistor connecting the I/O terminal to the collector of the first junction transistor, wherein the emitter of the second junction transistor is connected to the I/O terminal;
- an NMOS transistor having a gate connected to a power supply voltage, and a drain and a source respectively connected to the collector and emitter of the first junction transistor;
- second and third series connected resistors connecting the collector of the second junction transistor to the power supply voltage; and
- parallel first and second current discharge paths to which the source of the NMOS transistor and the emitter of the first junction transistor are commonly connected so as to discharge current into the power supply voltage; and
- a coupling connector electrically connected between respective second and third series connected resistors in each one of the first and second current discharge structures.

16. The multi-finger ESD protection device of claim 15, wherein the first current discharge path comprises a series connected combination of a fourth resistor and a first junction diode.

17. The multi-finger ESD protection device of claim 16, wherein the second current discharge path comprises a series connected combination of a fifth resistor and a second junction diode.

18. The multi-finger ESD protection device of claim 16, wherein the second current discharge path comprises a parallel resistor.

* * * * *